(12) United States Patent  
Tanaka et al.

(10) Patent No.: US 10,734,300 B2  
(45) Date of Patent: Aug. 4, 2020

(54) SEMICONDUCTOR DEVICE AND POWER CONVERTER

(71) Applicant: Mitsubishi Electric Corporation, Tokyo (JP)

(72) Inventors: Mitsugu Tanaka, Hyogo (JP); Yusuke Ishiyama, Hyogo (JP); Akitoshi Shirao, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/465,089

(22) PCT Filed: Dec. 8, 2016

(86) PCT No.: PCT/JP2016/086473  
§ 371 (c)(1),  
(2) Date: May 29, 2019

(87) PCT Pub. No.: WO2018/105075  
PCT Pub. Date: Jun. 14, 2018

(65) Prior Publication Data  
US 2019/0295915 A1    Sep. 26, 2019

(51) Int. Cl.  
*H01L 23/31* (2006.01)  
*H01L 25/07* (2006.01)  
(Continued)

(52) U.S. Cl.  
CPC .......... *H01L 23/3121* (2013.01); *H01L 23/12* (2013.01); *H01L 25/07* (2013.01);  
(Continued)

(58) Field of Classification Search  
CPC ..... H01L 23/3121; H01L 23/12; H01L 25/07; H01L 25/072  
(Continued)

(56) References Cited

U.S. PATENT DOCUMENTS

2015/0340350 A1    11/2015    Koga  
2016/0365299 A1    12/2016    Koga

FOREIGN PATENT DOCUMENTS

JP    S49-052975 A    5/1974  
JP    2005191178 A    7/2005  
(Continued)

OTHER PUBLICATIONS

An Office Action mailed by the Japanese Patent Office dated Dec. 3, 2019, which corresponds to Japanese Patent Application No. 2018-555394 and is related to U.S. Appl. No. 16/465,089; with English language translation.

(Continued)

*Primary Examiner* — Elias Ullah  
(74) *Attorney, Agent, or Firm* — Studebaker & Brackett PC

(57) ABSTRACT

A semiconductor device according to the present invention includes the following: a conductive layer disposed on an insulating substrate; a first semiconductor element and a second semiconductor element that are joined on an opposite surface of the conductive layer opposite from the insulating substrate, with a gap the first semiconductor element and the second semiconductor element; an electrode joined on an opposite surface of the first semiconductor element opposite from the conductive layer, and an opposite surface of the second semiconductor element opposite from the conductive layer, so as to extend over the gap; and resin sealing the conductive layer, the first semiconductor element, the second semiconductor element, and the electrode. The conductive layer has a recess pattern that is disposed on a surface being opposite from the insulating substrate and facing the gap, the recess pattern extending along the gap.

13 Claims, 7 Drawing Sheets

(51) Int. Cl.
*H02M 7/5387* (2007.01)
*H01L 25/18* (2006.01)
*H01L 23/12* (2006.01)

(52) U.S. Cl.
CPC ............ *H01L 25/072* (2013.01); *H01L 25/18* (2013.01); *H02M 7/53875* (2013.01)

(58) Field of Classification Search
USPC ........................................................ 257/692
See application file for complete search history.

(56) References Cited

FOREIGN PATENT DOCUMENTS

| JP | 2006222347 A | 8/2006 |
|---|---|---|
| JP | 2014-220383 A | 11/2014 |
| JP | 2015041716 A | 3/2015 |
| JP | 2015220429 A | 12/2015 |
| JP | 2016018866 A | 2/2016 |

OTHER PUBLICATIONS

International Search Report issued in PCT/JP2016/086473; dated Jan. 31, 2017.

F I G. 1 4
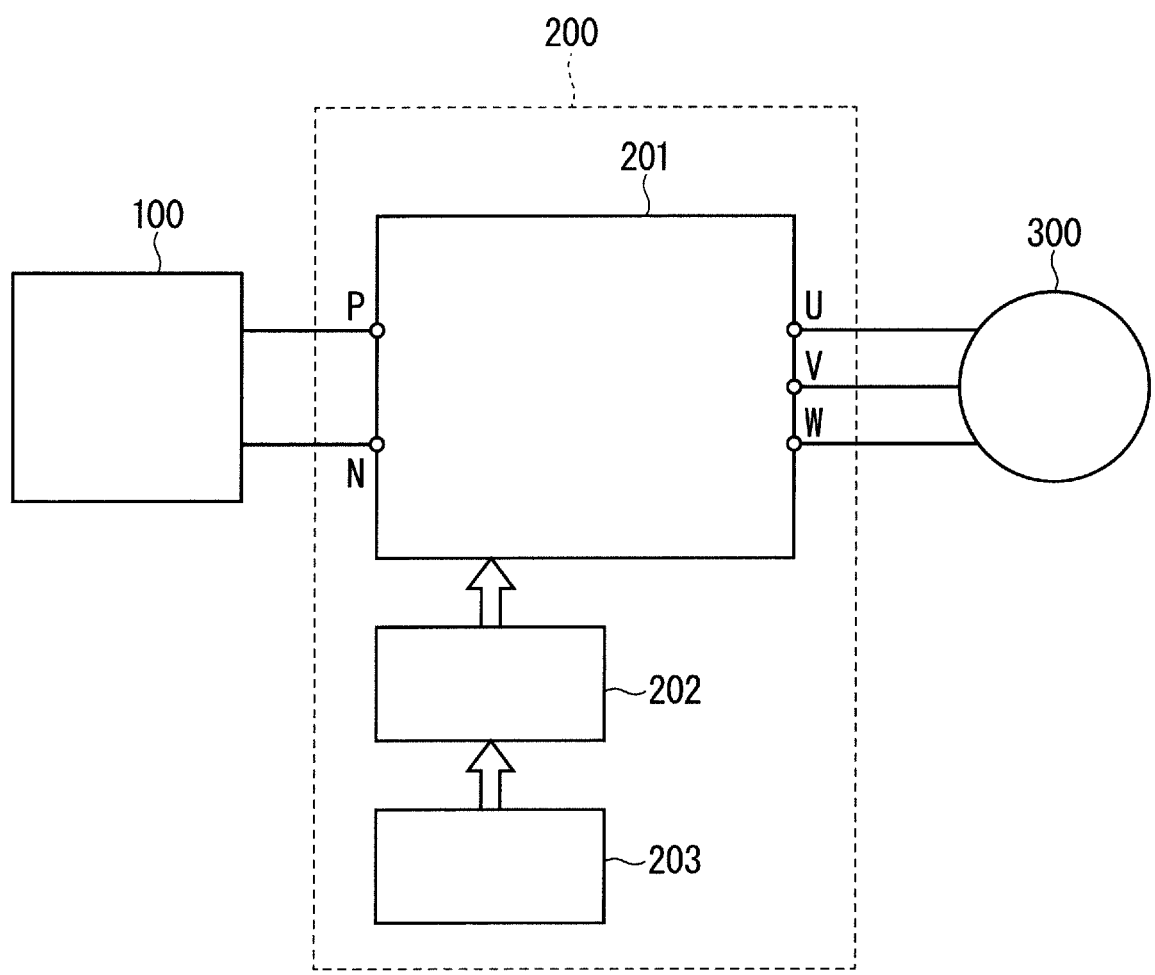

SEMICONDUCTOR DEVICE AND POWER CONVERTER

TECHNICAL FIELD

The present invention relates to a semiconductor device and a power converter.

BACKGROUND ART

Semiconductor devices having a plurality of semiconductor elements (e.g., switching elements) are used in apparatuses, such as inverters that control the motors of, for instance, electric vehicles or trains, and converters for energy regeneration. The inside of such a semiconductor device is typically sealed with resin.

The semiconductor device is configured in such a manner that the semiconductor elements are arranged to be adjacent to each other on a conductive layer, and that an electrode is joined in common on the upper surfaces of the adjacent semiconductor elements (c.f., Patent Document 1).

This configuration, which creates a narrow gap between the adjacent semiconductor elements, degrades resin flowability in the gap when the inside of the semiconductor device is sealed with the resin. The degraded resin flowability causes air to be trapped inside the resin in the gaps, thus remaining as air bubbles.

PRIOR ART DOCUMENT

Patent Document

Patent Document 1: Japanese Patent Application Laid-Open No. 2016-018866

SUMMARY

Problem to be Solved by the Invention

As earlier mentioned, the air bubbles remain inside the resin in a conventional semiconductor device. This causes the degradation in the reliability and insulation properties of the semiconductor device.

The resin flowability can improve by, for instance, injecting the resin in a decompressed atmosphere. Alternatively, the flowability can improve by heating the resin. Unfortunately, these possible methods increase facility cost and complicate process steps in the manufacture of the semiconductor device.

To solve these problems, it is an object of the present invention to provide a semiconductor device that prevents air bubbles inside component-sealing resin using a simple configuration, and to provide a power converter.

Means to Solve the Problem

A semiconductor device according to the present invention includes the following: a conductive layer disposed on an insulating substrate; a first semiconductor element and a second semiconductor element that are joined on an opposite surface of the conductive layer opposite from the insulating substrate, with a gap between the first semiconductor element and the second semiconductor element; an electrode joined on an opposite surface of the first semiconductor element opposite from the conductive layer, and an opposite surface of the second semiconductor element opposite from the conductive layer, so as to extend over the gap; and resin sealing the conductive layer, the first semiconductor element, the second semiconductor element, and the electrode. The conductive layer has a recess pattern that is disposed on a surface being opposite from the insulating substrate and facing the gap, the recess pattern extending along the gap.

Effects of the Invention

The conductive layer of the semiconductor device according to the present invention has an upper surface provided with the recess pattern along the gap between the first switching element and the second switching element. Such a configuration provides a large tunnel-like space defined by the conductive layer, the first and second switching elements, and the electrode. Consequently, the resin, when injected into the semiconductor device, flows through a large path in the tunnel-like space. This prevents air bubbles from remaining inside the resin in the gap between the first and second switching elements. The prevention of remaining air bubbles inside the resin prevents the degradation in the reliability and insulation properties of the semiconductor device. Furthermore, the semiconductor device according to the present invention is simply configured. Such a simple configuration prevents air bubbles from remaining inside the resin. This eliminates a process step for resin flowability enhancement from a process for manufacturing the semiconductor device, thereby preventing manufacture cost increase.

These and other objects, features, aspects and advantages of the present invention will become more apparent from the following detailed description of the present invention when taken in conjunction with the accompanying drawings.

BRIEF DESCRIPTION OF DRAWINGS

FIG. 14 is a diagram illustrating the configuration of a power conversion system according to a fourth embodiment.

DESCRIPTION OF EMBODIMENT(S)

First Embodiment

Figure 1:
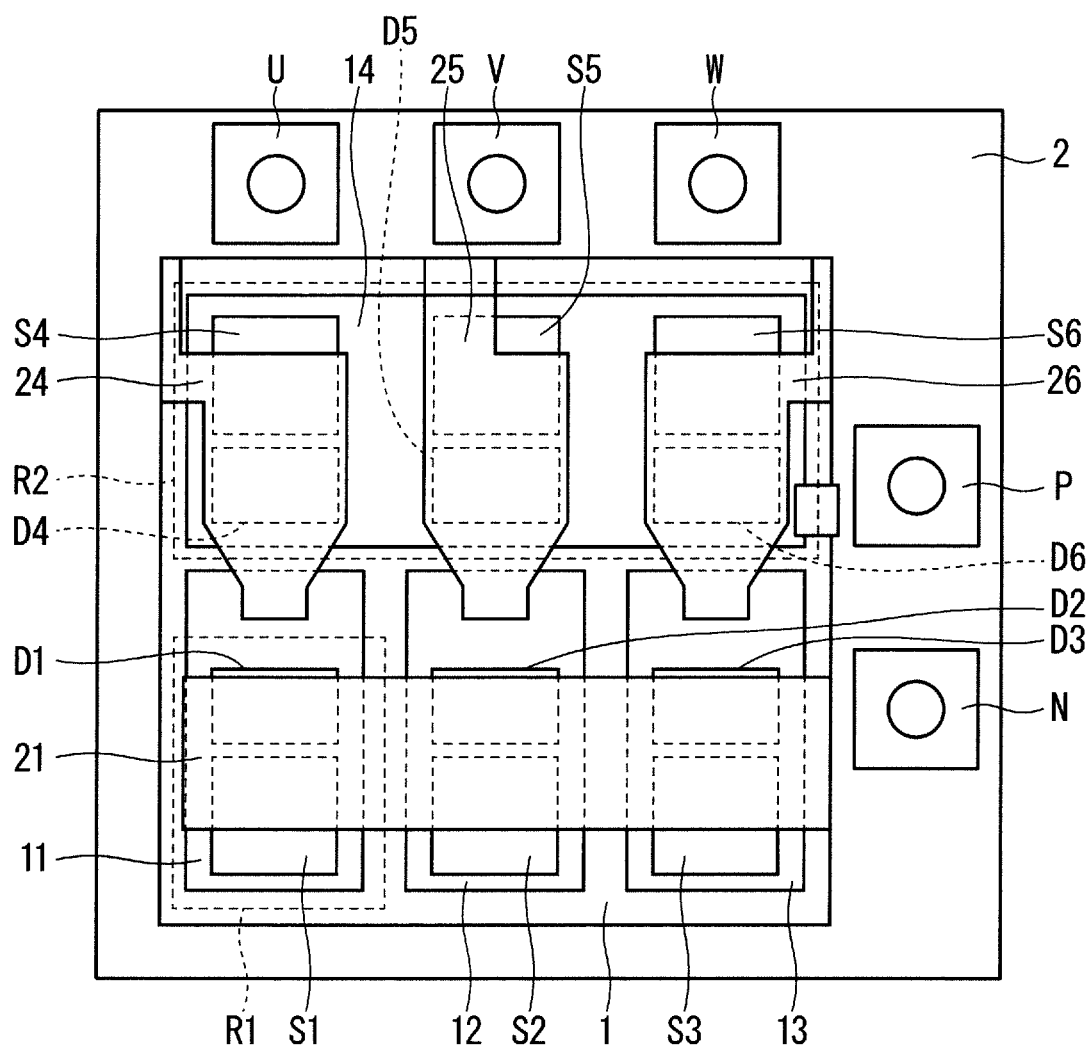
FIG. 1 is a plan view of a semiconductor device according to a first embodiment.

FIG. 1 is a plan view of a semiconductor device according to a first embodiment. The semiconductor device in the first embodiment is a three-phase (i.e., a U-phase, a V-phase, and a W-phase) semiconductor module used for, for instance, motor driving (that is, the semiconductor device includes six switching elements).

As illustrated in FIG. 1, the semiconductor device includes an insulating substrate 1, a plurality of conductive layers 11 to 14 disposed on the insulating substrate 1 so as to be separated from each other, six switching elements S1 to S6, six freewheeling diodes D1 to D6, and a plurality of electrodes 21 and 24 to 26. The conductive layers 11 to 14, the switching elements S1 to S6, and the freewheeling diodes D1 to D6 are sealed with resin 2. For easy illustration, FIG. 1 does not illustrate the resin 2 in the periphery of the conductive layers 11 to 14 in FIG. 1.

The conductive layers 11 to 14 are each made of, for instance, aluminum or an aluminum-containing alloy. The switching elements S1 to S6 each have upper and lower surfaces provided with main electrodes. The switching elements S1 to S6 each have a control electrode on part of its upper surface. It is noted that when each of the switching elements S1 to S6 has a current sensing function, a temperature sensing function, and other functions, the upper surface of the switching element may be provided with, for instance, an electrode for current sensing and an electrode for temperature sensing, in addition to the main electrodes and the control electrode. Examples of each of the switching elements S1 to S6 include an insulated gate bipolar transistor (IGBT) and a metal-oxide-semiconductor field-effect transistor (MOSFET). The switching elements S1 to S6 are each formed of a wide-bandgap semiconductor of, for instance, SiC or GaN.

The freewheeling diodes D1 to D6 each have upper and lower surfaces provided with main electrodes. Examples of each of the freewheeling diodes D1 to D6 include a Schottky barrier diode (SBD) and a PN junction diode. The freewheeling diodes D1 to D6 are each formed of a wide-bandgap semiconductor of, for instance, SiC or GaN.

The U-phase, V-phase, and W-phase of the semiconductor device have circuit configurations similar to each other. Accordingly, the configuration of the U-phase circuit will be described.

The switching elements S1 and S4 are connected to each other in series to constitute the upper and lower arms in the U-phase. The freewheeling diode D1 is connected to the switching element S1 in inverse parallel. The freewheeling diode D4 is connected to the switching element S4 in inverse parallel. In the first embodiment, the switching element S1 is also referred to as a first semiconductor element S1. In addition, the freewheeling diode D1 is also referred to as a second semiconductor element D1.

The switching element S1 and the freewheeling diode D1 are joined on the upper surface of the conductive layer 11 (i.e., an opposite surface opposite from the insulating substrate 1) with a gap between the switching element S1 and the freewheeling diode D1. The electrode 21 is joined on an upper-surface electrode of the switching element S1 and an upper-surface electrode of the freewheeling diode D1 so as to extend over the gap. Here, the upper-surface electrode of the switching element S1 is the main electrode disposed on an opposite surface of the switching element S1 opposite from the conductive layer 11. Likewise, the upper-surface electrode of the freewheeling diode D1 is the main electrode disposed on an opposite surface of the freewheeling diode D1 opposite from the conductive layer 11.

The switching element S4 and the freewheeling diode D4 are joined on the upper surface of the conductive layer 14 (i.e., an opposite surface opposite from the insulating substrate 1) with a gap between the switching element S4 and the freewheeling diode D4. The electrode 24 is joined on an upper-surface electrode of the switching element S4 and an upper-surface electrode of the freewheeling diode D4 so as to extend over the gap. Here, the upper-surface electrode of the switching element S4 is the main electrode disposed on an opposite surface of the switching element S4 opposite from the conductive layer 11. Likewise, the upper-surface electrode of the freewheeling diode D4 is the main electrode disposed on an opposite surface of the freewheeling diode D4 opposite from the conductive layer 11.

The electrode 21 is also joined to an electrode terminal N. The conductive layer 14 is also joined to an electrode terminal P. The electrode 24 is also joined to the conductive layer 11 and a U-phase electrode terminal U.

The V-phase circuit includes the switching elements S2 and S4, the freewheeling diodes D2 and D4, the conductive layers 12 and 14, the electrodes 21 and 25, and a V-phase electrode terminal V. The V-phase circuit is configured similarly to the U-phase circuit.

The W-phase circuit includes the switching elements S3 and S6, the freewheeling diodes D3 and D6, the conductive layers 13 and 14, the electrodes 21 and 26, and a W-phase electrode terminal W. The W-phase circuit is configured similarly to the U-phase circuit.

Figure 2:
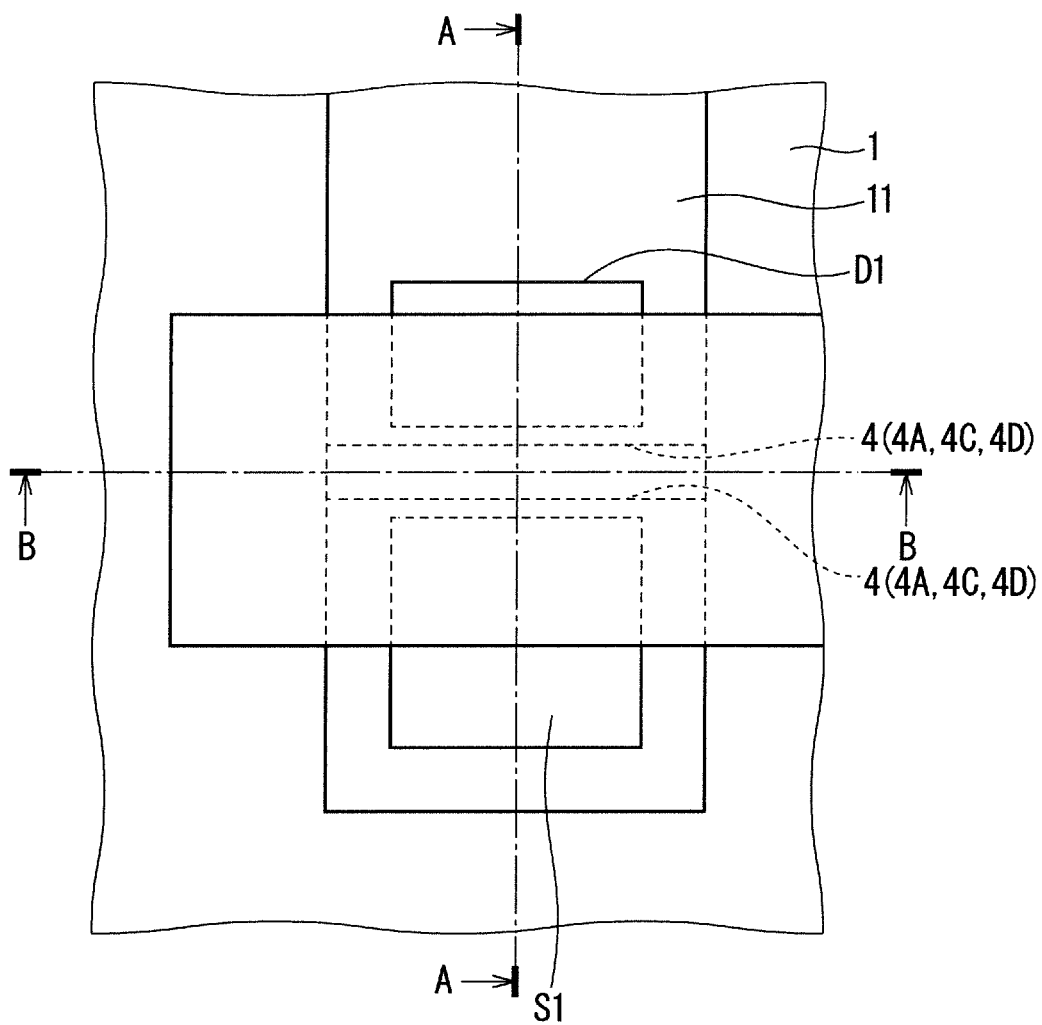
FIG. 2 is an enlarged plan view of part of the semiconductor device according to the first embodiment.

FIG. 2 is an enlarged plan view of a region R1 of the semiconductor device in FIG. 1. As illustrated in FIG. 2, the conductive layer 11 has a recess pattern 4 on its upper surface (i.e., the opposite surface of the conductive layer 11 opposite from the insulating substrate 1). The recess pattern 4 is disposed along the gap between the switching element S1 and the freewheeling diode D1. The recess pattern 4 is disposed from one side of the conductive layer 11 to another side of the conductive layer 11.

Figure 3:
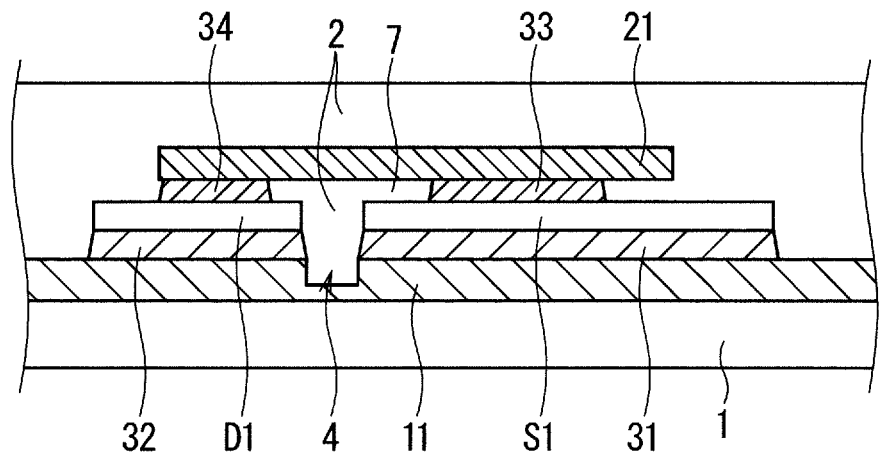
FIG. 3 is a cross-sectional view of the semiconductor device according to the first embodiment.

FIG. 3 is a cross-sectional view of the semiconductor device taken along line A-A in FIG. 2. As illustrated in FIG. 3, the conductive layer 11 is disposed on the insulating substrate 1. The switching element S4 and the freewheeling diode D4 are joined on the upper surface of the conductive layer 11 using solder 31 and solder 32, respectively, with a gap between the switching element S4 and the freewheeling diode D4. The electrode 21 is joined on the upper-surface electrode of the switching element S1 using solder 33, and is joined on the upper-surface electrode of the freewheeling diode D1 using solder 34. The electrode 21 is joined to extend over the gap between the switching element S1 and the freewheeling diode D1.

As illustrated in FIG. 3, the recess pattern 4 on the upper surface of the conductive layer 11 is a groove extending along the gap between the switching element S1 and the freewheeling diode D1.

Figure 4:
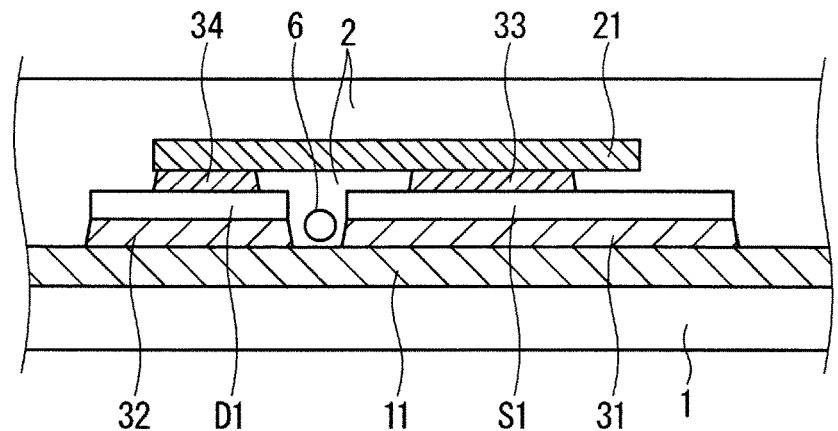
FIG. 4 is a cross-sectional view of a semiconductor device according to a comparative example.

FIG. 4 is a cross-sectional view of a semiconductor device according to a comparative example. The upper surface of the conductive layer 11 has no recess pattern 4 in this comparative example. The resin 2 is typically highly viscous even before cured, and thus has low flowability. The resin 2 in the comparative example in FIG. 4 flows through a narrow path in a tunnel-like portion. Accordingly, an air bubble 6 tends to remain inside the resin 2 in the gap between the switching element S1 and the freewheeling diode D1 when the resin 2 is injected into the semiconductor device.

Meanwhile, the semiconductor device according to the first embodiment, illustrated in FIG. 3, has a groove, which is the recess pattern 4, disposed on the upper surface of the conductive layer 11 so as to extend along the gap between the switching element S1 and the freewheeling diode D1.

Accordingly, a large tunnel-like space is formed that is defined by the conductive layer 11, the switching element S1, the freewheeling diode D1, and the electrode 21. Consequently, the resin 2, when injected into the semiconductor device, flows through a large path in the tunnel-like space. This prevents air bubbles from remaining inside the resin 2 in the gap between the switching element S1 and the freewheeling diode D1.

In some cases, there is a gap 7 between part of the upper surface of the switching element S1 and the electrode 21, in the tunnel-like space as illustrated in FIG. 3. In the first embodiment, the recess pattern 4, which is a groove, enables the resin 2 to flow through a large path in the tunnel-like space. This prevents air bubbles from remaining inside the resin 2 in the gap 7 between part of the upper surface of the switching element S1 and the electrode 21.

It is noted that although the first embodiment describes that the semiconductor device is a three-phase semiconductor module as illustrated in FIG. 1, this is one example. The semiconductor device in the first embodiment may have any configuration other than that in FIG. 1. The semiconductor device in the first embodiment needs to have at least the configurations illustrated in FIGS. 2 and 3.

It is also noted that although FIGS. 2 and 3 illustrate the recess pattern 4 disposed on the upper surface of the conductive layer 11 so as to extend along the gap between the switching element S1 and the freewheeling diode D1, the recess pattern 4 may be disposed in a different location. The recess pattern 4 may be disposed on the upper surface of the conductive layer 12 so as to extend along a gap between the switching element S2 and the freewheeling diode D2. Alternatively, the recess pattern 4 may be disposed on the upper surface of the conductive layer 13 so as to extend along a gap between the switching element S3 and the freewheeling diode D3.

Figure 5:
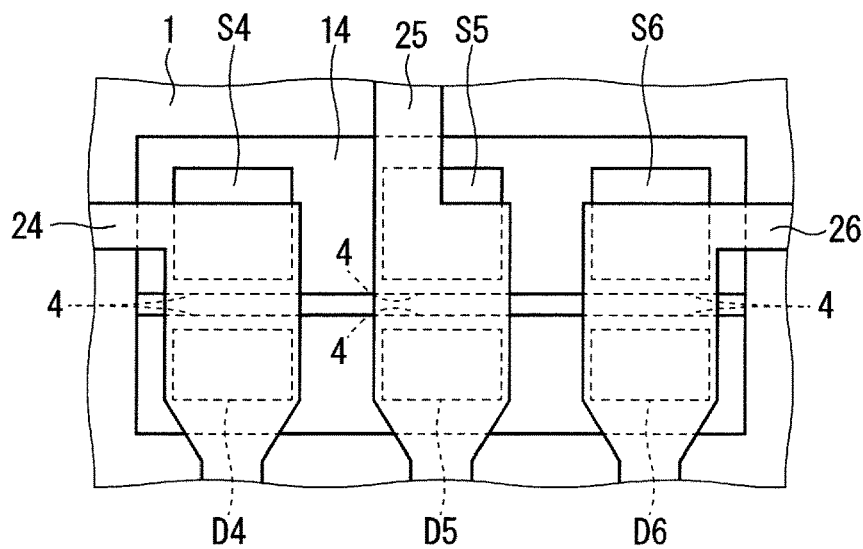
FIG. 5 is an enlarged plan view of part of the semiconductor device according to the first embodiment.

FIG. 5 is an enlarged plan view of a region R2 of the semiconductor device in FIG. 1. As illustrated in FIG. 5, the recess pattern 4 may be disposed on the upper surface of the conductive layer 14 so as to extend along a gap between the switching element S4 and the freewheeling diode D4. Likewise, the recess pattern 4 may be disposed on the upper surface of the conductive layer 14 so as to extend along a gap between the switching element S5 and the freewheeling diode D5. Likewise, the recess pattern 4 may be disposed on the upper surface of the conductive layer 14 so as to extend along a gap between the switching element S6 and the freewheeling diode D6. Alternatively, a plurality of recess patterns 4 may be connected to each other on the conductive layer 14 to constitute a series of recess patterns 4.

It is also noted that the first semiconductor element and the second semiconductor element, although respectively being a switching element and a freewheeling diode in the first embodiment, each may be any semiconductor element. For instance, both the first semiconductor element and the second semiconductor element may be switching elements.

Effects

The semiconductor device in the first embodiment includes the following: the conductive layer 11 disposed on the insulating substrate 1; the first semiconductor element (i.e., the switching element S1) and the second semiconductor element (i.e., the freewheeling diode D1) that are joined on an opposite surface of the conductive layer 11 opposite from the insulating substrate 1, with a gap between the first semiconductor element and the second semiconductor element; the electrode 21 joined on an opposite surface of the first semiconductor element opposite from the conductive layer 11, and an opposite surface of the second semiconductor element opposite from the conductive layer 11, so as to extend over the gap; and the resin 2 sealing the conductive layer 11, the first semiconductor element, the second semiconductor element, and the electrode 21. The conductive layer 11 has the recess pattern 4 that is disposed on a surface being opposite from the insulating substrate 1 and facing the gap, the recess pattern 4 extending along the gap.

The recess pattern 4 is disposed on the upper surface of the conductive layer 11 so as to extend along the gap between the switching element S1 and the freewheeling diode D1. Accordingly, the tunnel-like space, defined by the conductive layer 11, the switching element S1, the freewheeling diode D1, and the electrode 21, is enlarged. Consequently, the resin 2, when injected into the semiconductor device, flows through a large path in the tunnel-like space. This prevents air bubbles from remaining inside the resin 2 in the gap between the switching element S1 and the freewheeling diode D1. The prevention of remaining air bubbles inside the resin 2 prevents the degradation in the reliability and insulation properties of the semiconductor device.

Furthermore, according to the semiconductor device in the first embodiment, the simple structure of the semiconductor device itself prevents air bubbles from remaining inside the resin 2. This eliminates a process step (e.g., placing the semiconductor device in a decompressed atmosphere or heating the resin 2) for the flowability enhancement of the resin 2, from a process for manufacturing the semiconductor device; manufacture cost increase, therefore, is prevented.

The recess pattern 4 of the semiconductor device in the first embodiment has a groove extending along the gap. Accordingly, the groove, which is the recess pattern, enables the resin 2 to flow through a large path in the tunnel-like space when the resin 2 is injected into the semiconductor device.

The recess pattern 4 of the semiconductor device in the first embodiment is disposed from one side of the conductive layer 11 to another side of the conductive layer 11. The recess pattern 4 is disposed from the one side of the conductive layer 11 to the other side of the conductive layer 11. The recess pattern 4 is thus disposed through the tunnel-like space, which is defined by the conductive layer 11, the switching element S1, the freewheeling diode D1, and the electrode 21. Consequently, the recess pattern 4 enables the resin 2 to flow through a large path in the entire tunnel-like space.

The first semiconductor element of the semiconductor device in the first embodiment is the switching element S1 whose upper surface and lower surface are each provided with main electrodes. The second semiconductor element of the semiconductor device in the first embodiment is the freewheeling diode D1 whose upper surface and lower surface are each provided with main electrodes. Accordingly, the first and second semiconductor elements constitute a switching circuit having a switching element and a freewheeling diode connected to each other in inverse parallel.

First Modification of First Embodiment

Figure 6:
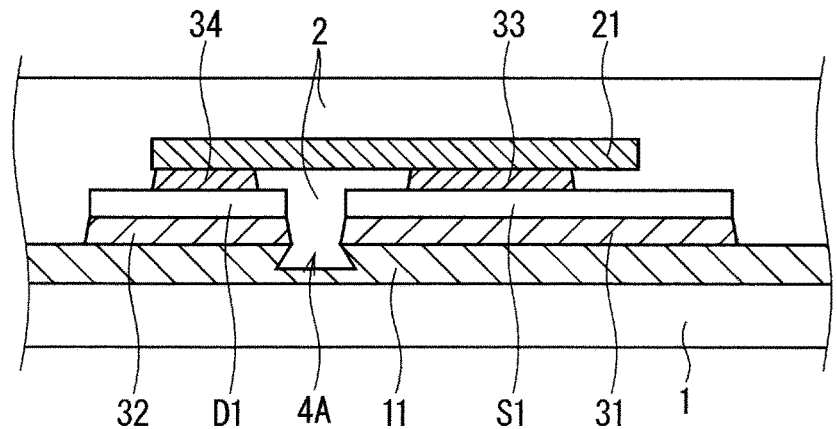
FIG. 6 is a cross-sectional view of a semiconductor device according to a first modification of the first embodiment.

FIG. 6 is a cross-sectional view of a semiconductor device according to a first modification of the first embodiment. The cross-section in FIG. 6 corresponds to the cross-section of the semiconductor device taken along line A-A in FIG. 2.

A recess pattern 4A in this modification has a groove shape, like the recess pattern 4 in the first embodiment. Further, the groove of the recess pattern 4A in the modification has a greater width on a bottom side of the conductive layer 11 than on a surface side of the conductive layer 11.

In the modification, the groove width of the recess pattern 4A is greater on the bottom side of the conductive layer 11 than on the surface side of the conductive layer 11. Consequently, the adhesion between the resin 2 and the recess pattern 4A improves. This prevents the resin 2 from peeling off the conductive layer 11, thereby further improving the reliability of the semiconductor device.

Second Modification of First Embodiment

Figure 7:
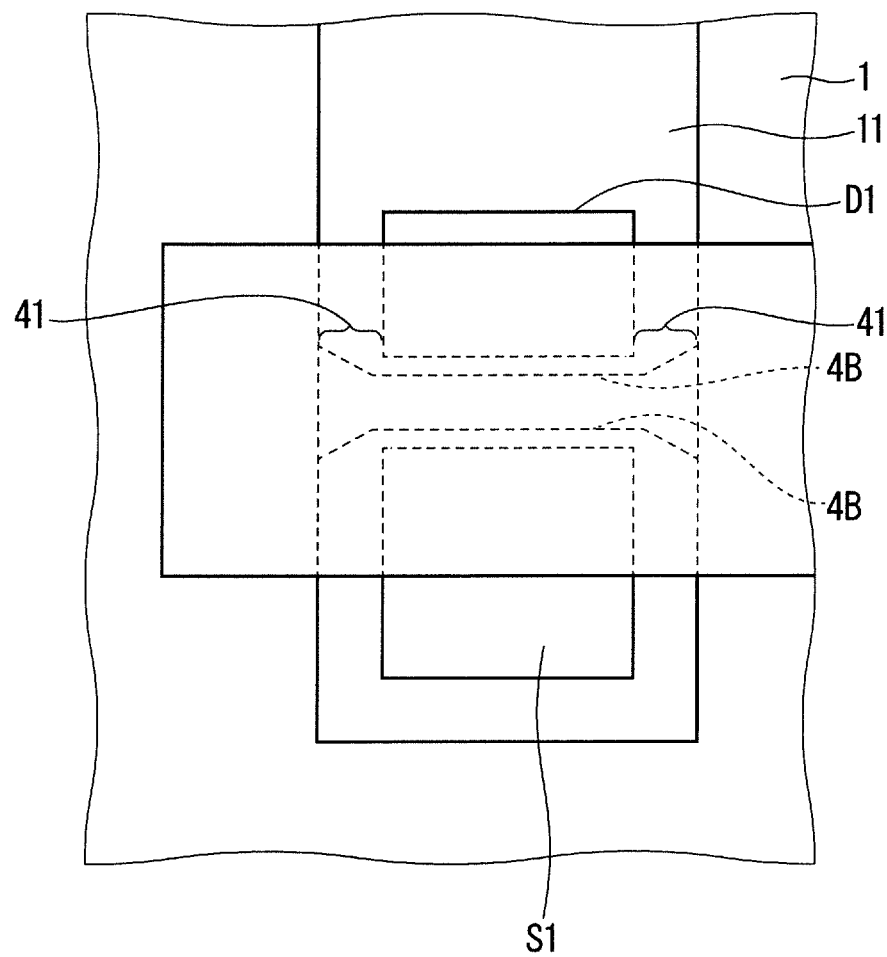
FIG. 7 is a plan view of a semiconductor device according to a second modification of the first embodiment.

FIG. 7 is a plan view of a semiconductor device according to a second modification of the first embodiment. The plan view in FIG. 7 corresponds to the enlarged plan view of the region R1 of the semiconductor device in FIG. 1.

A recess pattern 4B in this modification has a groove shape, like the recess pattern 4 in the first embodiment. Further, in the modification, the groove of the recess pattern 4B has, at each of both end portions 41 of the groove, such a width as to increase toward the end of the groove.

Accordingly, the resin 2, when injected into the semiconductor device, flows through a path that is large at both end portions 41. This enhances the flowability of the resin 2, thereby further preventing air bubbles from remaining inside the resin 2 in the gap between the switching element S1 and the freewheeling diode D1.

Third Modification of First Embodiment

Figure 8:
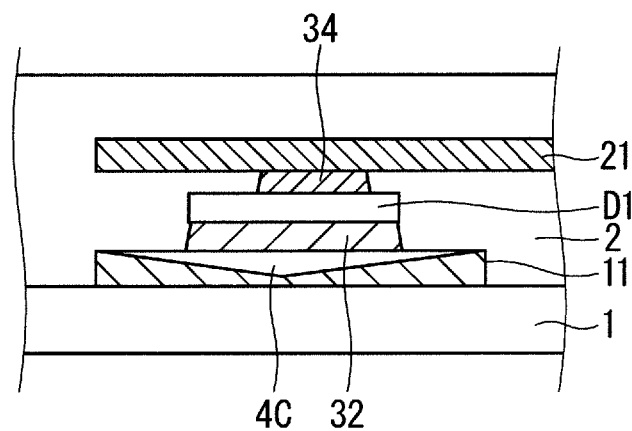
FIG. 8 is a cross-sectional view of a semiconductor device according to a third modification of the first embodiment.

FIG. 8 is a cross-sectional view of a semiconductor device according to a third modification of the first embodiment. The cross-section in FIG. 8 corresponds to the cross-section of the semiconductor device taken along line B-B in FIG. 2.

A recess pattern 4C in this modification has a groove shape, like the recess pattern 4 in the first embodiment. Further, the groove of the recess pattern 4C in the modification has such a depth as to increase from each of both end portions of the groove toward the middle portion of the groove.

The groove depth of the recess pattern 4C increases from each of both end portions of the groove toward the middle portion of the groove. Accordingly, the followability of the resin 2 improves in the recess pattern 4C when the resin 2 is injected into the semiconductor device. This further prevents air bubbles from remaining inside the resin 2 in the gap between the switching element S1 and the diode D1.

Fourth Modification of First Embodiment

Figure 9:
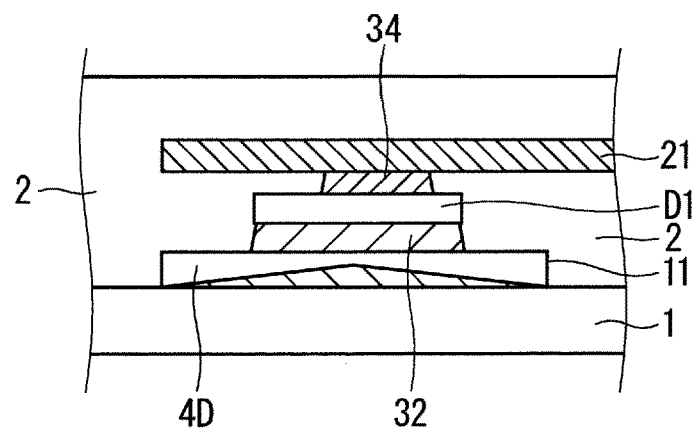
FIG. 9 is a cross-sectional view of a semiconductor device according to a fourth modification of the first embodiment.

FIG. 9 is a cross-sectional view of a semiconductor device according to a fourth modification of the first embodiment. The cross-section in FIG. 9 corresponds to the cross-section of the semiconductor device taken along line B-B in FIG. 2.

A recess pattern 4D in this modification has a groove shape, like the recess pattern 4 in the first embodiment. Further, the groove of the recess pattern 4D in the modification has such a depth as to decrease from each of both end portions of the groove toward the middle portion of the groove.

The groove depth of the recess pattern 4D decreases from each of both end portions of the groove toward the middle portion of the groove. Accordingly, the followability of the resin 2 improves in the recess pattern 4D when the resin 2 is injected into the semiconductor device. This further prevents air bubbles from remaining inside the resin 2 in the gap between the switching element S1 and the diode D1.

Second Embodiment

Figure 10:
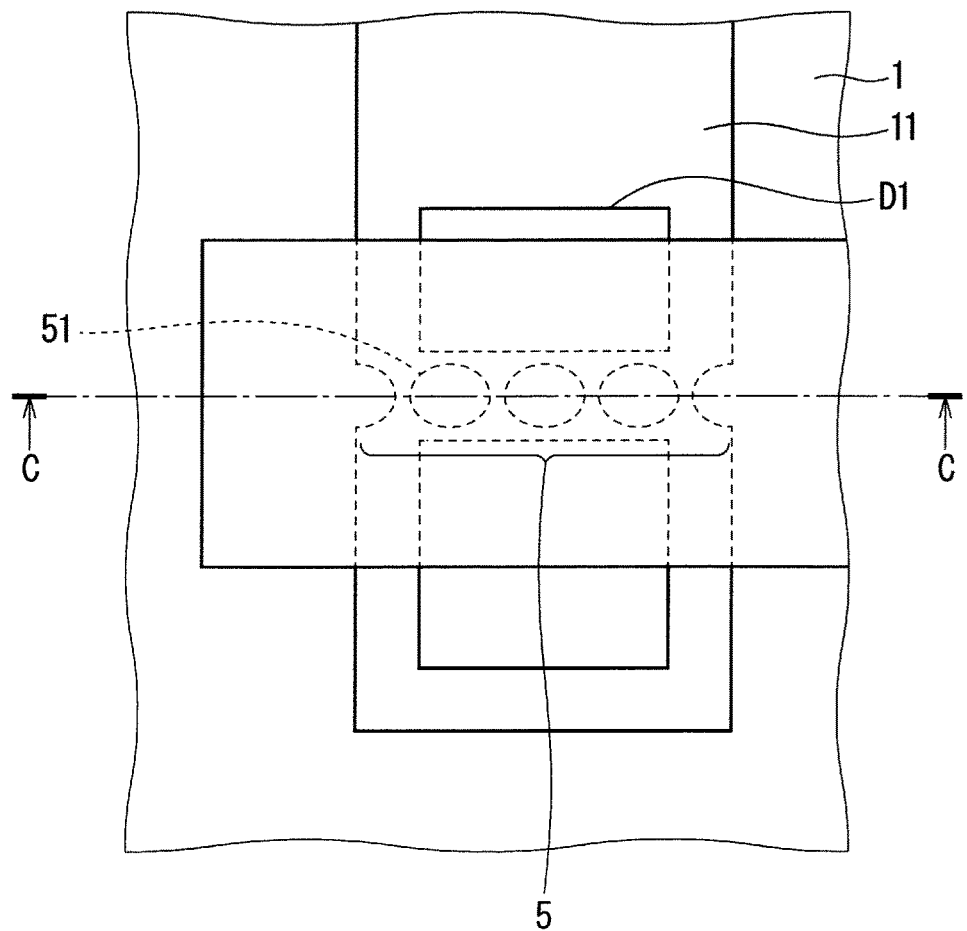
FIG. 10 is a plan view of a semiconductor device according to a second embodiment.

FIG. 10 is a plan view of a semiconductor device according to a second embodiment. The plan view in FIG. 10 corresponds to the enlarged plan view of the region R1 of the semiconductor device in FIG. 1. Further, FIG. 11 is a cross-sectional view of the semiconductor device taken along line C-C in FIG. 10.

The first embodiment has described that the recess pattern 4 of the semiconductor device is a groove. Meanwhile, the semiconductor device in the second embodiment has a recess pattern 5 provided with a plurality of recesses 51. The configuration of the semiconductor device in the second embodiment, which is the same as that of the semiconductor device in the first embodiment except the recess pattern 5, will be not elaborated upon.

As illustrated in FIG. 10, the recess pattern 5 is disposed on the upper surface of the conductive layer 11 (i.e., an opposite surface of the conductive layer 11 opposite from the insulating substrate 1). The recess pattern 5 is disposed along the gap between the switching element S1 and the freewheeling diode D1. The recess pattern 5 is disposed from one side of the conductive layer 11 to another side of the conductive layer 11.

Figure 11:
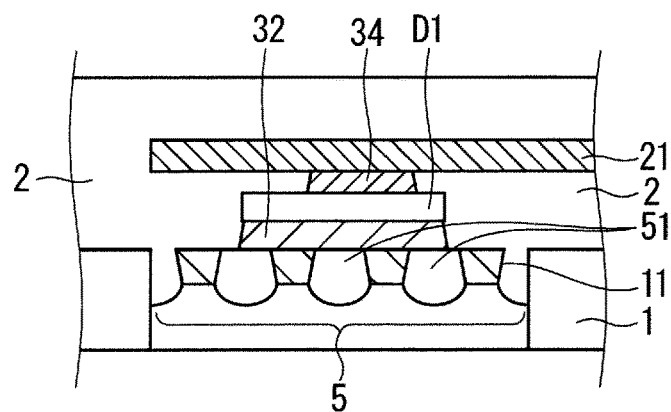
FIG. 11 is a cross-sectional view of the semiconductor device according to the second embodiment.

As illustrated in FIGS. 10 and 11, the recess pattern 5 has the recesses 51. Each recess 51 has a circular-hole shape for instance. Further, as illustrated in FIG. 11, each recess 51 has a greater width on a bottom side than on an opening side. Still further, as illustrated in FIG. 11, each recess 51 may extend through the conductive layer 11 to reach the insulating substrate 1.

Effects

The recess pattern 5 of the semiconductor device in the second embodiment has the plurality of recesses 51. Accordingly, the recesses 51 of the recess pattern enable the resin 2 to flow through a large path in the tunnel-like space when the resin 2 is injected into the semiconductor device. The path for the resin 2 in the tunnel-like space is enlarged. This prevents air bubbles from remaining inside the resin 2 in the gap between the switching element S1 and the freewheeling diode D1. The prevention of remaining air bubbles inside the resin 2 prevents the degradation in the reliability and insulation properties of the semiconductor device.

Furthermore, according to the semiconductor device in the second embodiment, the simple structure of the semiconductor device itself prevents air bubbles from remaining inside the resin 2. This eliminates a process step (e.g., placing the semiconductor device in a decompressed atmosphere or heating the resin 2) for the flowability enhancement of the resin 2, from a process for manufacturing the semiconductor device; manufacture cost increase, therefore, is prevented.

In the semiconductor device in the second embodiment, each recess 51 of the recess pattern 5 has a greater width on a bottom side than on an opening side. Consequently, the adhesion between the resin 2 and the recess pattern 5 improves. This prevents the resin 2 from peeling off the conductive layer 11, thereby further improving the reliability of the semiconductor device.

In the semiconductor device in the second embodiment, each recess 51 of the recess pattern 5 may extend through the conductive layer 11 to reach the insulating substrate 1. The insulating substrate 1, the conductive layer 11, and the resin 2 are brought into close contact with each other when each recess 51 has a depth such that the recess 51 extends through the conductive layer 11 to reach the insulating substrate 1. This further prevents the resin 2 from peeling off, thereby further improving the reliability of the semiconductor device.

Third Embodiment

Figure 12:
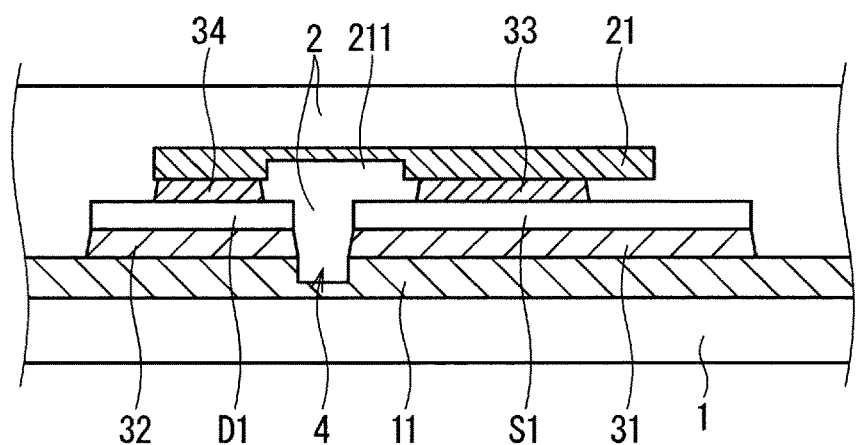
FIG. 12 is a cross-sectional view of a semiconductor device according to a third embodiment.

FIG. 12 is a cross-sectional view of a semiconductor device according to a third embodiment. The cross-section in FIG. 12 corresponds to the cross-section of the semiconductor device taken along line A-A in FIG. 2.

Like the corresponding one in the first embodiment, the recess pattern 4 in the third embodiment is disposed on the upper surface of the conductive layer 11 so as to extend along a gap between the switching element S1 and the freewheeling diode D1. Further, the electrode 21 in the third embodiment has a groove 211 disposed on a surface of the electrode 21 on a conductive-layer-11 side, so as to extend along the gap between the switching element S1 and the freewheeling diode D1 in plan view.

The semiconductor device in the third embodiment has the groove 211 on the electrode 21 in addition to a groove (i.e., the recess pattern 4) on the upper surface of the conductive layer 11. Accordingly, a tunnel-like portion is more enlarged that is defined by the conductive layer 11, the switching element S1, the freewheeling diode D1, and the electrode 21. Consequently, the resin 2, when injected into the semiconductor device, flows through a larger path in the tunnel-like portion. This prevents air bubbles from remaining inside the resin 2 in the gap between the switching element S1 and the freewheeling diode D1.

It is noted that where the groove 211 is disposed is not limited to the location illustrated in FIG. 11. The groove 211 may be disposed on a surface on a conductive-layer-12 side of the electrode 21, so as to extend along a gap between the switching element S2 and the freewheeling diode D2 in plan view. Alternatively, the groove 211 may be disposed on a surface on a conductive-layer-13 side of the electrode 21, so as to extend along a gap between the switching element S3 and the freewheeling diode D3 in plan view.

Alternatively, the groove 211 may be disposed on a surface on a conductive-layer-14 side of the electrode 24, so as to extend along a gap between the switching element S4 and the freewheeling diode D4 in plan view. Alternatively, the groove 211 may be disposed on a surface on a conductive-layer-14 side of the electrode 25, so as to extend along a gap between the switching element S5 and the freewheeling diode D5 in plan view. Alternatively, the groove 211 may be disposed on a surface on a conductive-layer-14 side of the electrode 26, so as to extend along a gap between the switching element S6 and the freewheeling diode D6 in plan view.

It is noted that the recess pattern 5, which is described in the second embodiment, may be provided in the third embodiment instead of the recess pattern 4, which is described in the first embodiment.

Modification of Third Embodiment

Figure 13:
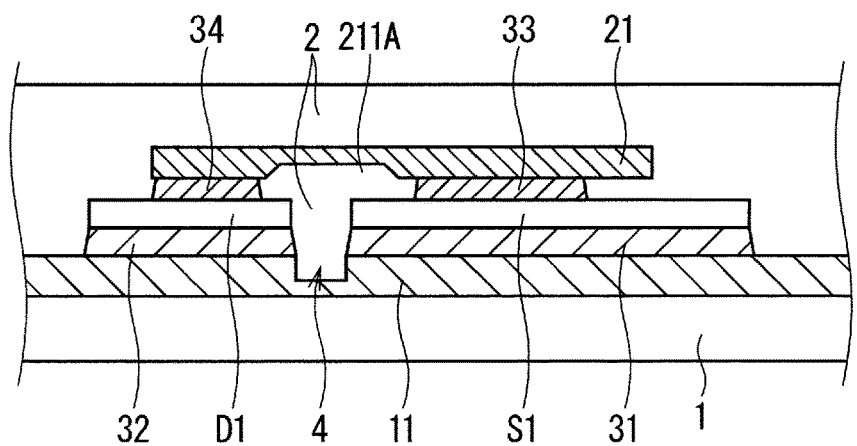
FIG. 13 is a cross-sectional view of a semiconductor device according to a modification of the third embodiment.

FIG. 13 is a cross-sectional view of a semiconductor device according to a modification of the third embodiment. Like the groove 211 in the third embodiment, a groove 211A in this modification is disposed on a surface of the electrode 21 on a conductive-layer-11 side, so as to extend along a gap between the switching element S1 and the freewheeling diode D1 in plan view. As illustrated in FIG. 13, the groove 211A has a greater width on a surface side than on a bottom side.

This facilitates resin entrance to the groove 211A when the resin 2 is injected into the semiconductor device. Consequently, the resin 2, when injected into the semiconductor device, flows through a larger path in a tunnel-like portion. This further prevents air bubbles from remaining inside the resin 2 in the gap between the switching element S1 and the freewheeling diode D1.

Fourth Embodiment

A fourth embodiment describes that the semiconductor device in any of the first to third embodiments is included in a power converter. Although the power converter in the present invention is not limited to a particular power converter, the fourth embodiment describes a power converter that is a three-phase inverter.

FIG. 14 is a diagram illustrating the configuration of a power conversion system according to the fourth embodiment. A power converter 200 illustrated in FIG. 14 is connected to a power supply 100 and a load 300. The power supply 100 is a DC power supply and supplies DC power to the power converter 200. The power supply 100 can be composed of various things, such as a DC system, a photovoltaic cell, or a storage battery. Alternatively, the power supply 100 may be composed of a rectifier circuit connected to an AC system, an AC-to-DC converter, or other apparatuses. Alternatively, the power supply 100 may be composed of a DC-to-DC converter that converts DC power sent from a DC system into predetermined power.

The power converter 200 is a three-phase inverter connected between the power supply 100 and the load 300. The power converter 200 converts the DC power, supplied from the power supply 100, into AC power, and supplies the AC power to the load 300. As illustrated in FIG. 13, the power converter 200 includes a main conversion circuit 201, a drive circuit 202, and a control circuit 203. The main conversion circuit 201 converts the DC power into the AC power, and then outputs the AC power. The drive circuit 202 outputs drive signals for driving each switching element of the main conversion circuit 201. The control circuit 203 outputs control signals for controlling the drive circuit 202 to the drive circuit 202.

The load 300 is a three-phase electric motor driven by the AC power supplied from the power converter 200. It is noted that the load 300 is not limited to an electric motor for a particular use, but is an electric motor mounted on various kinds of electrical equipment. The load 300 is an electric motor for, for instance, a hybrid vehicle, an electric vehicle, a railway vehicle, an elevator, or an air conditioner.

The following details the power converter 200. The main conversion circuit 201 includes a switching element and a freewheeling diode. Switching of the switching element converts the DC power, supplied from the power supply 100, into the AC power, thus supplying the AC power to the load 300. Although there are various specific circuit configurations of the main conversion circuit 201, the main conversion circuit 201 in the fourth embodiment is a three-phase two-level full-bridge circuit. The main conversion circuit 201 includes six switching elements (i.e., the switching elements S1 to S6 in FIG. 1), and six freewheeling diodes (i.e., the freewheeling diodes D1 to D6 in FIG. 1) respectively connected to the switching elements S1 to S6 in inverse parallel.

The six switching elements are separated into three sets (i.e., a U-phase, a V-phase, and a W-phase) of two switching elements. The two switching elements in each set are connected to each other in series to constitute upper and lower arms. Output terminals in the individual sets, that is, the output terminals in the U-phase, the V-phase, and the W-phase, are connected to the load 300.

The drive circuit 202 generates the drive signals for driving each switching element of the main conversion circuit 201, and supplies the drive signals to the control electrode of each switching element of the main conversion circuit 201. To be specific, the drive circuit 202 supplies the drive signal for turning on the switching element and the drive signal for turning off the switching element, to the control electrode of each switching element in accordance with control signals from a control circuit 203, which will be described later on. In keeping the switching element ON, the driving signal is a voltage signal (an ON signal) equal to or greater than a threshold voltage of the switching element. In keeping the switching element OFF, the drive signal is a voltage signal (an OFF signal) equal to or less than the threshold voltage of the switching element.

The control circuit 203 controls each switching element of the main conversion circuit 201 to supply a desired voltage to the load 300. To be specific, the control circuit 203 calculates, based on power to be supplied to the load 300, a time (ON time) during which each switching element of the main conversion circuit 201 is to be turned on. For instance, the control circuit 203 controls, through PWM control, the ON time of the switching element in accordance with a voltage to be output from the main conversion circuit 201. Then, the control circuit 203 outputs control commands (control signals) to the drive circuit 202 so that at each time point, the ON signal is output to the switching elements to be turned on, and the OFF signal is output to the switching elements to be turned off. The drive circuit 202 outputs the ON signal or the OFF signal to the control electrode of each switching element as a drive signal in accordance with this control signal.

The power converter 200 in the fourth embodiment includes the main conversion circuit 201 having the semiconductor device in any of the first to third embodiments. Such a configuration prevents the degradation in the reliability and insulation properties of the power converter 200. This configuration also prevents increase in cost for manufacturing the power converter 200.

It is noted that although the fourth embodiment has described that the power converter 200 is a three-phase two-level inverter, the power converter 200 may have any configuration; for instance, the power converter 200 may be a three-level power converter or a multi-level power converter. Alternatively, the power converter 200 may be a single-phase inverter that supplies power to a single-phase load. Alternatively, the power converter may be a DC-to-DC converter or an AC-to-DC converter.

The load 300, connected to the power converter 200 of the fourth embodiment, is not limited to the electric motor. For instance, the load 300 may be an electrical discharge machine, a laser beam machine, an induction-heating cooking utensil, or a contactless power-supply system. Further the power converter 200 can be used as a power conditioner for a photovoltaic system, a storage battery system, or other systems.

Effects

The power converter 200 in the fourth embodiment includes the main conversion circuit 201 that converts power that is input, and then outputs the power, the drive circuit 202 that outputs a drive signal for driving the main conversion circuit 201 to the main conversion circuit 201, and the control circuit 203 that outputs a control signal for controlling the drive circuit 202 to the drive circuit 202. The main conversion circuit 201 includes at least one of the semiconductor devices according to any of the first to third embodiments. Such a configuration prevents the degradation in the reliability and insulation properties of the power converter 200 in the fourth embodiment. This configuration also prevents increase in cost for manufacturing the power converter 200.

It is noted that in the present invention, the individual embodiments can be freely combined, or can be modified and omitted as appropriate, within the scope of the invention. While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 insulating substrate, 2 resin, 4, 4A, 4B, 4C, 4D, 5 recess pattern, 6 air bubble, 7 gap 11, 12, 13, 14 conductive layer, 21, 24, 25, 26 electrode, 31, 32, 33, 34 solder, 211, 211A groove, S1, S2, S3, S4, S5, S6 switching element, D1, D2, D3, D4, D5, D6 freewheeling diode, 100 power supply, 200 power converter, 201 main conversion circuit, 202 drive circuit, 203 control circuit, 300 load.

The invention claimed is:

1. A semiconductor device comprising:
a conductive layer disposed on an insulating substrate;
a first semiconductor element and a second semiconductor element that are joined on an opposite surface of the conductive layer opposite from the insulating substrate, with a gap between the first semiconductor element and the second semiconductor element;
an electrode joined on an opposite surface of the first semiconductor element opposite from the conductive layer, and an opposite surface of the second semiconductor element opposite from the conductive layer, so as to extend over the gap; and
resin sealing the conductive layer, the first semiconductor element, the second semiconductor element, and the electrode,
the conductive layer comprising a recess pattern that is disposed on a surface being opposite from the insulating substrate and facing the gap, the recess pattern extending along the gap.

2. The semiconductor device according to claim 1, wherein the recess pattern comprises a groove extending along the gap.

3. The semiconductor device according to claim 2, wherein the groove of the recess pattern has a greater width on a bottom side than on a surface side.

4. The semiconductor device according to claim 2, wherein the groove of the recess pattern has, at each of both end portions of the groove, such a width as to increase toward an end of the groove.

5. The semiconductor device according to claim 2, wherein the groove of the recess pattern has such a depth as to decrease or increase from each of both end portions of the groove toward a middle portion of the groove.

6. The semiconductor device according to claim 1, wherein the recess pattern comprises a plurality of recesses.

7. The semiconductor device according to claim 6, wherein each of the plurality of recesses of the recess pattern has a greater width on a bottom side than on an opening side.

8. The semiconductor device according to claim 6, wherein each of the plurality of recesses of the recess pattern extends through the conductive layer to reach the insulating substrate.

9. The semiconductor device according to claim 1, wherein the recess pattern extends from one side of the conductive layer to another side of the conductive layer.

10. The semiconductor device according to claim 1, wherein the electrode comprises a groove disposed on a surface of the electrode on a conductive-layer side so as to extend along the gap in plan view.

11. The semiconductor device according to claim 10, wherein the groove of the electrode has a greater width on a surface side than on a bottom side.

12. The semiconductor device according to claim 1, wherein
the first semiconductor element is a switching element comprising an upper surface and a lower surface each provided with a main electrode, and
the second semiconductor element is a freewheeling diode comprising an upper surface and a lower surface each provided with a main electrode.

13. A power converter comprising:
a main conversion circuit configured to convert power that is input, and then output the power;
a drive circuit configured to output a drive signal for driving the main conversion circuit to the main conversion circuit; and
a control circuit configured to output a control signal for controlling the drive circuit to the drive circuit,
the main conversion circuit comprising the semiconductor device according to claim 1.

* * * * *